United States Patent [19]

Ide et al.

[11] Patent Number: 4,739,288

[45] Date of Patent: Apr. 19, 1988

[54] COMBINED PHASE AND FREQUENCY MODULATOR FOR MODULATING AN INFORMATION SIGNAL

[75] Inventors: John Ide, Raleigh; Keith C. Hyatt, Wake Forest, both of N.C.

[73] Assignee: Teletec Corporation, Raleigh, N.C.

[21] Appl. No.: 30,592

[22] Filed: Mar. 27, 1987

[51] Int. Cl.$^4$ ............................ H03C 3/09; H03C 3/40
[52] U.S. Cl. ...................................... 332/19; 332/21; 332/22; 332/23 R; 455/112; 455/113
[58] Field of Search ................... 332/19, 21, 22, 23 R, 332/23 A; 455/42, 75, 76, 110, 112, 113; 331/23

[56] References Cited

U.S. PATENT DOCUMENTS

| | | | |
|---|---|---|---|
| 4,068,198 | 1/1978 | Otto | 332/19 |
| 4,114,110 | 9/1978 | Nossen | 332/19 X |
| 4,481,489 | 11/1984 | Kurby | 332/19 |

Primary Examiner—Siegfried H. Grimm
Attorney, Agent, or Firm—Breneman & Georges

[57] ABSTRACT

A combined phase and frequency modulation device for modulating a data signal in order to generate a plurality of narrow band signals for a communication system is disclosed, characterized by a direct synthesis phase locked loop for generating an output data signal having a selected frequency, a signal divider and phase modulator circuit, and a frequency multiplier for multiplying a modulated signal to produce an output having a desired frequency. The signal divider and phase modulator circuit includes a frequency divider which produces two quadrature related signals from the output data signal. A modulator connected with the frequency divider generates a suppressed carrier double sideband signal from one of the quadrature related signals. A summing device connected with the frequency divider and with the modulator combines the carrier signal with the other quadrature related signal to produce the modulated output signal which is multiplied by the frequency multiplier.

7 Claims, 3 Drawing Sheets

COMBINED PHASE AND FREQUENCY MODULATOR FOR MODULATING AN INFORMATION SIGNAL

CROSS REFERENCE TO RELATED APPLICATIONS

The present invention is interrelated to the subject matter disclosed in copending patent applications entitled: (1) Bidirectional Digital Serial Interface For Communicating Digital Signals Including Digitized Audio Between Microprocessor-Based Control And Transceiver Units of Two-Way Radio Communication Equipment filed on Mar. 27, 1987 as U.S. application Ser. No. 031,003; and (2) Computerized Multistandard, Field-Convertible Multiregional/Multiservice, Remote Controllable Remote Programmable Mobile Two-Way Radio System With Digital Serial Bus Link, Built-In Programmer And Autodiagnostics filed on Mar. 27, 1987 as U.S. application Ser. No. 030,743 the disclosures of which are incorporated herein by reference.

BACKGROUND OF THE INVENTION

1. Field of the Invention

The present invention relates to an improved modulation method and apparatus providing phase and frequency modulation for generating the narrow band signals required for many communications systems, specifically those of multichannel mobile and fixed base systems using low and high VHF bands and UHF bands. The invention uses both a direct synthesized frequency source and a narrow band FM modulator.

The improved modulation method and apparatus according to the invention provides modulation of up to 5.0 KHz peak deviation in response to modulating signals from approximately 60 Hz to 3.5 KHz. Typical systems require pre-emphasis using conventional 750 $\mu$ sec delays to maintain optimum modulation levels. Distortion levels of less than 1.0% are desirable with frequency response performance less than 6 db over an audio frequency range of 300 Hz to 3.0 KHz.

2. Brief Description of the Prior Art

Frequency synthesizers for radio applications and frequency shift key modulators for communication apparatus are well-known in the patented prior art as evidenced by the U.S. patents to Nossen U.S. Pat. No. 4,114,110 and Otto U.S. Pat. No. 4,068,198, respectively. The Nossen patent for example discloses a frequency synthesizer employing dual phase lock loops for rapid switching and fine resolution. The Otto patent discloses a phase locked loop frequency shift key modulator wherein the loop includes a programmable divider and wherein the output of the oscillator is also divided to obtain the desired carrier frequency.

As will be developed in greater detail below, while the prior devices normally operate satisfactorily, they each possess inherent drawbacks including limited frequency range, degradation of the modulating signal, an undesirable signal to noise ratio, and impracticality owing to increased complexity and cost.

The present invention was developed in order to overcome these and other drawbacks of the prior devices by providing a modulation method and apparatus which is simple to manufacture and suffers from no mechanical perturbations. The phase locked loop parameters of the invention may be selected for optimum system spectral response and modulation is independent of the desired transmit frequencies.

SUMMARY OF THE INVENTION

Accordingly, it is a primary object of the present invention to provide a combined phase and angle modulating device for modulating a data signal in order to generate a plurality of narrow band signals for a communication system. The modulation device includes a direct synthesis phase locked loop for receiving the data signal and for generating an output data signal having a selected frequency. A frequency divider is connected with the phase locked loop and produces two quadrature related signals from the output data signal. A phase modulator is connected with the frequency divider for generating a suppressed carrier double sideband signal from one of the quadrature related signals and a summing device is connected with the frequency divider and with the modulator to combine the carrier signal with the other quadrature related signal to produce a modulated output signal. A frequency multiplier is connected with the summing device for multiplying the modulated output signal to produce a modulated signal having a desired frequency.

According to a more specific object of the invention the phase modulator may include a delay line.

It is yet another object of the invention to provide a voltage controlled oscillator in the direct synthesis phase locked loop for selecting the frequency of the output signal, the selected frequency being a submultiple of the desired frequency of the modulated signal.

According to another object of the invention, the direct synthesis phase locked loop includes a programmable divider connected in a feedback circuit with the voltage controlled oscillator for controlling the selected frequency of the output data signal.

BRIEF DESCRIPTION OF THE DRAWINGS

Other objects and advantages of the invention will become apparent from a study of the following specification when viewed in the light of the accompanying drawings in which.

DETAILED DESCRIPTION OF THE INVENTION

The advantages of the present invention will be evident from an understanding of current modulation systems shown in FIGS. 1–4 and the drawbacks and limitations thereof.

Figure 1:
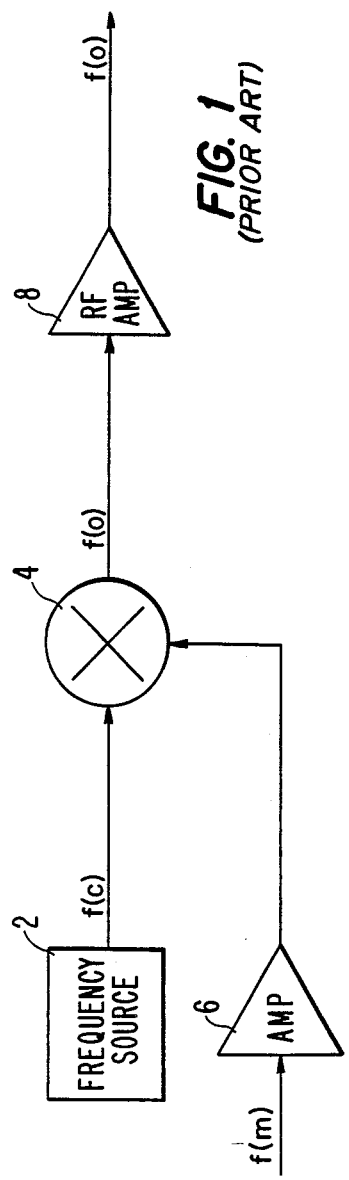
FIGS. 1–4 are schematic diagrams of different modulation systems known in the prior art.

A simple modulation system is shown in FIG. 1 and comprises a frequency source 2 which delivers a carrier frequency f(c) to a reactance modulator 4 such as a delay line. The modulator generates a phase shift proportional to a modulating signal f(m) which is amplified by an audio amplifier 6 before being delivered to the modulator 4. The modulated output signal f(o) is amplified by a radio frequency amplifier 8.

The primary drawback of the modulation device of FIG. 1 is that a predictable phase shift may only be generated over a very limited frequency range. Thus the modulation system is useless unless several tuning changes are implemented in the reactance network. Essentially, the modulator causes the instantaneous phase of the carrier frequency f(c) to be varied at the audio signal rate proportional to the modulating signal f(m). The output signal f(o) is then applied to the corresponding transmitter for broadcasting.

Figure 2:
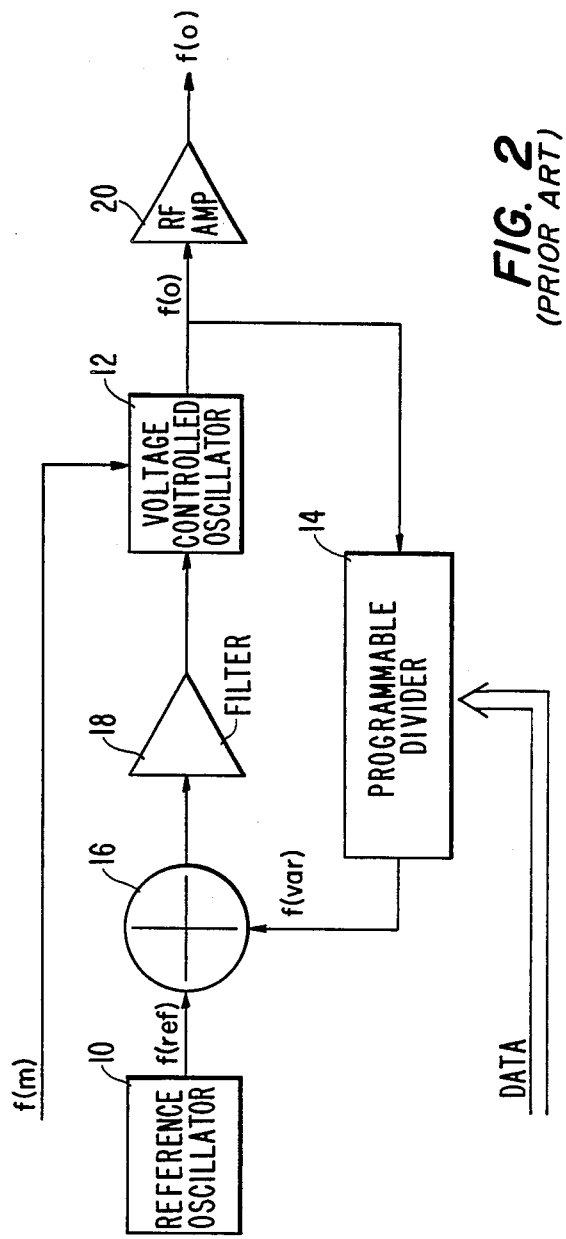

The second modulation system shown in FIG. 2 basically comprises a frequency synthesizer circuit of a transmitter driver. A reference oscillator 10 provides a reference frequency f(ref) to a voltage controlled oscillator 12. The modulating signal f(m) is applied to the timing control of the voltage controlled oscillator to vary the instantaneous phase of the voltage controlled oscillator at a rate proportional to the modulating signal. A portion of the output of the voltage controlled oscillator is fed back to the reference frequency via a phase locked loop comprising a programmable divider LSI device 14 to which digital data to be transmitted is input. The variable frequency output f(var) from the programmable divider is combined with the reference frequency at a summing device 16. The combined signal is filtered by a loop filter 18 prior to delivery to the voltage controlled oscillator 10. The modulated output f(o) is amplified by a radio frequency amplifier 20 to provide the modulated data output signal which is supplied to the transmitter for broadcasting.

The modulation device of FIG. 2 is simple in construction but exhibits several problems. For example, most voltage controlled oscillators do not exhibit linear voltage to frequency transfer functions and thus produce distortion and modulation that is different for variations in voltage controlled oscillator frequencies. Since the voltage controlled oscillator must provide different frequencies depending upon the desired operating channel, modulation will vary by the selected channel. Furthermore, since the voltage controlled oscillator is an integral part of a phase locked loop, the dynamic characteristics of the loop will affect the desired modulation. To prevent significant degradation of the modulating signal, the phase locked loop parameters must be chosen to provide closed loop response below the lowest desired modulating frequency. Since this is typically as low as 50 Hz, it produces a phase locked loop that is extremely sensitive to mechanical disturbances and interference and produces noticeable microphonic activity in response to mechanical shock and vibration inputs.

Figure 3:
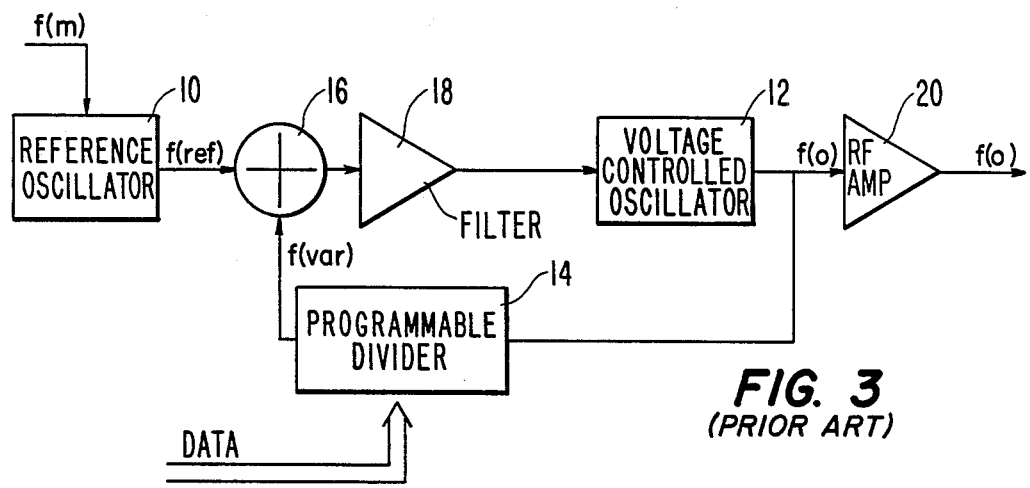

The system of FIG. 3 attempts to overcome the problems of the system of FIG. 2 by using the same components (having the same reference numerals) and by using the modulation method of FIG. 1, but by causing the reference frequency to be varied at the modulating signal f(m) rate. This overcomes the problem of limited frequency range of the modulator means, but imposes severe restrictions on the phase locked loop bandwidth. This bandwidth must now be higher than the highest desired modulating frequency; otherwise severe phase distortion will result. By having the loop bandwidth extremely high, severe spurious problems result since the loop now faithfully reproduces any spurious signals within its bandwidth, including low frequency phase noise signals that degenerate the signal to noise ratio of the final transmit signal f(o) to undesirable low levels and limit the total system dynamic range.

Figure 4:
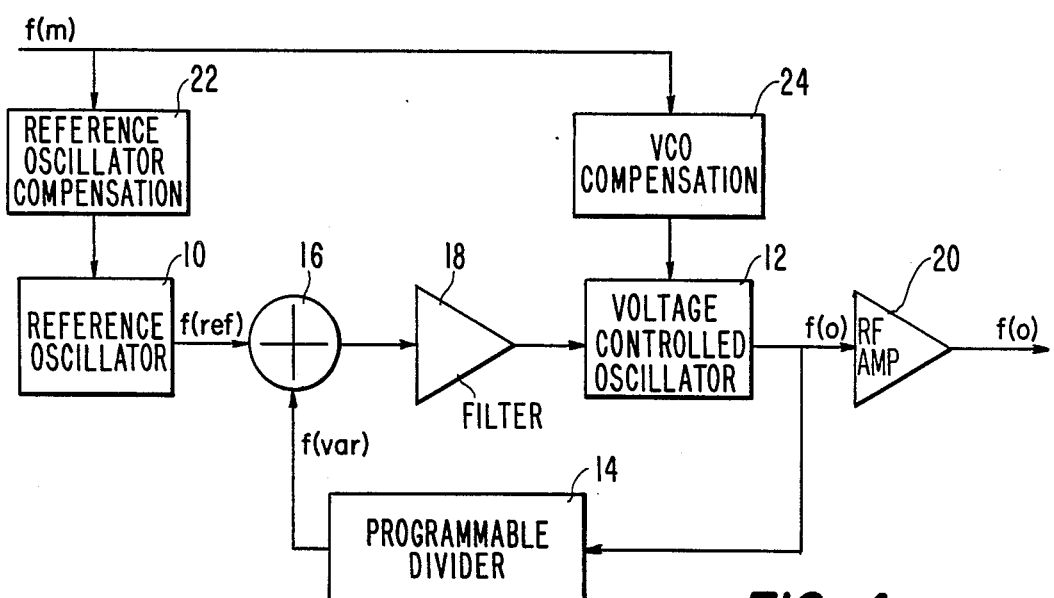

In the system of FIG. 4 the same reference numerals have been used for the same components of the systems of FIGS. 2 and 3. The modulation system of FIG. 4 attempts to minimize the disadvantages of the systems of FIGS. 2 and 3 by providing dual modulation wherein both the reference frequency signal and the voltage controlled oscillator signal are modulated by the modulating signal f(m). Adjustable reference oscillator compensation 22 and voltage controlled oscillator compensation 24 devices are provided for adjusting the modulating signal f(m) applied to the reference oscillator 10 and voltage controlled oscillator 12, respectively.

With the device of FIG. 4, the loop bandwidth may be chosen to optimize the frequency synthesizer characteristics for both dynamic performance and spectral purity and the frequency response and gain or both of the modulating signal inputs must be carefully matched to avoid phase and frequency distortion. Although theoretically possible, the system of FIG. 4 is not practical from a manufacturing point of view due to the precise nature of the gain and frequency response balance required by both modulator inputs.

Figure 5:
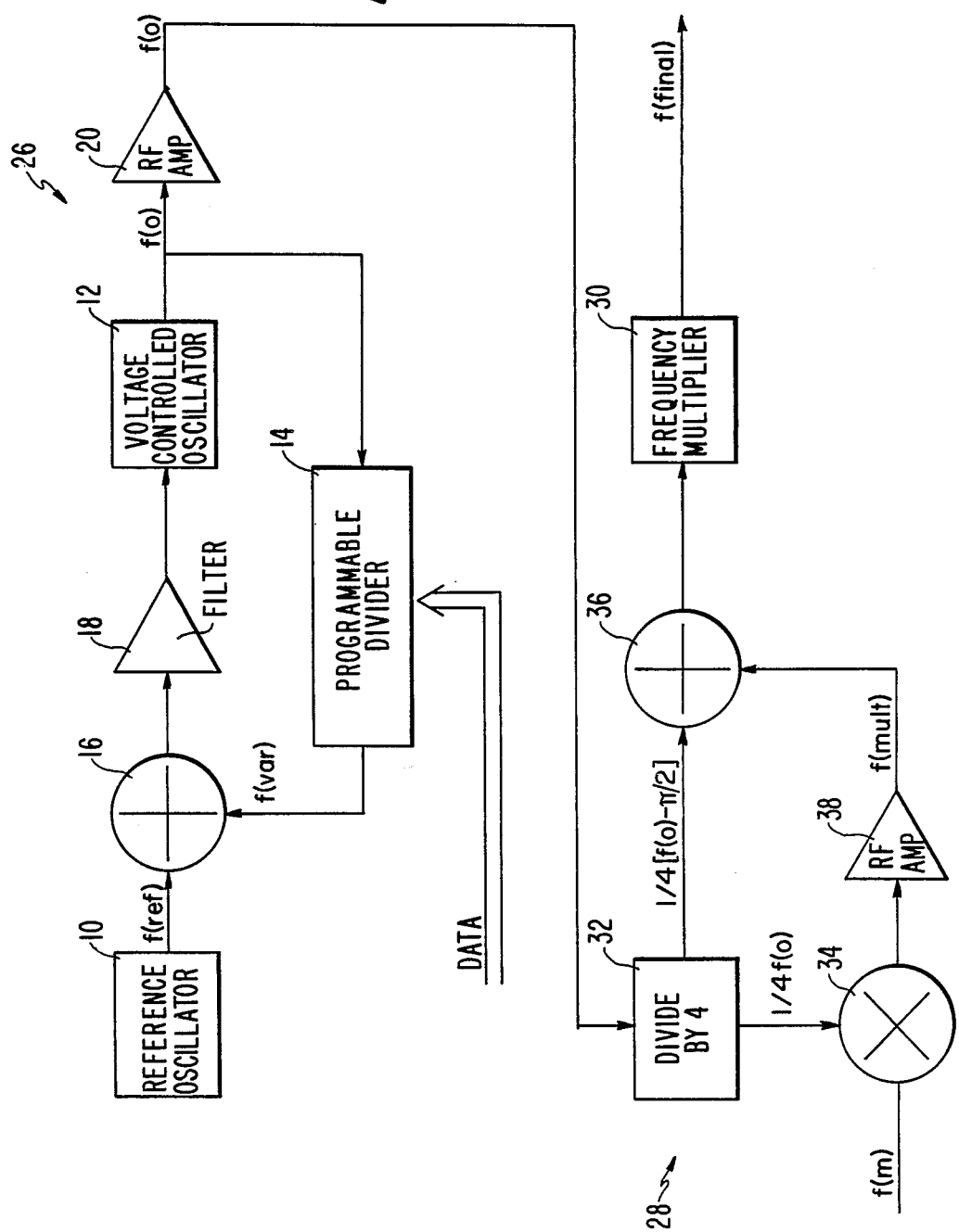
FIG. 5 is a schematic diagram of the improved angle modulation system according to the invention.

The combined phase and frequency modulation system according to the invention is shown in FIG. 5. The system utilizes th direct synthesis phase locked loop 26 of the system of FIGS. 2 and 3, a frequency divider phase modulator circuit 28, and a frequency multiplier 30. The direct synthesis phase locked loop includes the reference oscillator 10 summing device 16, filter 18, voltage controlled oscillator 12, programmable divider LSI device 14, and radio frequency amplifier 20 shown and described in FIGS. 2 and 3. The loop utilizes the LSI device 14 for frequency control, phase locked to a stable reference frequency source. The amplified output of the loop circuit 26 comprises an output data signal having a selected frequency which is a submultiple of the final frequency desired for broadcast.

The output data signal is delivered to a frequency divider 32 for division by a convenient even integer ratio such as four to generate two signals related to one another by a 90 degree phase shift. One of these quadrature related signals $\frac{1}{4} f(O)$ is applied to a balanced modulator 34 such as a delay line and multiplied by the desired modulating signal f(m) to generate a suppressed carrier double side-band signal f(mult) which is delivered to a summing device 36. A radio frequency amplifier 38 arranged between the modulator 34 and the summing device 36 amplifies the suppressed carrier double sideband signal which has sideband phase characteristics identical to a narrow band phase modulated signal. To produce the complete modulated spectrum, the carrier is reinserted with the other quadrature related signal $\frac{1}{4} (fo - \pi/2)$ at the summing device 36. The output from the summing device is an integer submultiple of the transmitted frequency and is multiplied at the frequency multiplier 30 by a chosen multiple to provide the desired frequency modulated spectrum. The final output signal f(final) is situated at the desired transmit frequency and faithfully represents a narrow band phase modulated signal having upper and lower sidebands of opposite phase.

The improved phase/frequency modulation method and system of the present invention shown in FIG. 5 has a number of advantages over conventional modulation systems that are used for multi-channel communication. First, since the signal produced by the direct synthesis phase locked loop is typically at some integer submultiple of the final desired output frequency, selecting the specific submultiple to yield a frequency within a range of approximately 5 to 20 MHz allows all channeling to be accomplished by the LSI controlled phase locked loop with no VHF or UHF variable module prescaling. The voltage controlled oscillator in the 5 to 20 MHz range can be constructed with known methods to be mechanically stable and, since it does not reside directly at the final desired output frequency, is not subject to pulling or other direct interference from the high power transmitter that follows this modulation system. Furthermore, the dynamic characteristics of the direct synthesis loop can be selected with only the channeling time and spectral purity concerns as primary issues since it does not impact the modulation that is applied after the frequency generation.

The final modulation deviation of 5.0 KHz peak is produced at the balanced modulator at levels that are less than desired by the same ratio as that produced by the final frequency multiplier 30 a typical ratio of 40 requires a narrow band deviation of 5.0/40 KHz or 125 Hz at a modulating frequency of 3.0 KHz. This represents a modulation index of 125/3000 or 0.0417, well below the definitions of narrow band modulation. Since the balanced modulator can easily be made to operate over the frequency range produced by the direct synthesis loop, no critical returning or band switching is required. The modulator operates well at all design frequencies if the submultiple for the final multiplier ratio is correctly chosen.

The input frequency to the final multiplier 30 represents a narrow band modulated signal. In order for the multiplier to faithfully reproduce the complete spectrum, it must have a bandwidth that is greater than the desired modulation bandwidth. The multiplier technique chosen in this case includes a phase locked loop with an integral frequency divider 14 in the feedback path having a divider ratio of 40. The bandwidth of the phase locked loop can readily be designed greater than the modulation requirements dictate because the reference frequency for the loop is essentially the output frequency of the summing device or several MHz. This provides no complications for spurious considerations and allows loop dynamic performance choices directed by the modulating signal bandwidth and distortion requirements only. Furthermore, since the bandwidth will by necessity be greater than the highest audio frequency, the loop also has the inherent capability of instantaneously correcting for any mechanical perturbations, and will therefore be impervious to microphonics.

Furthermore, since the final frequency multiplication ratio of the multiplier loop remains constant, the modulation is not varied as a function of nonlinear VCO transfer functions. The modulator system of the present invention is also not subject to mechanical disturbances and requires only one simple adjustment to balance the balanced modulator stage.

While in accordance with the provisions of the Patent Statute the preferred forms and embodiment of the invention have been illustrated and described, it will be apparent to those skilled in the art that various changes and modifications may be made without deviating from the inventive concepts set forth above.

What is claimed is:

1. A combined phase and frequency modulation device for modulating a data signal in order to generate a plurality of narrow band signals for a communication system, comprising
   (a) direct synthesis phase locked loop means for receiving the data signal and for generating an output data signal having a selected frequency;
   (b) frequency divider means connected with said phase locked loop means for producing two quadrature related signals from said output data signal;
   (c) modulator means connected with said divider means for generating a suppressed carrier double sideband signal from one of said quadrature related signals;
   (d) a summing device connected with said divider means and with said modulator means for combining said carrier signal with said other quadrature related signal to produce a modulated output signal;
   (e) frequency multiplier means connected with said summing device for multiplying said modulated signal to a desired frequency.

2. The apparatus as defined in claim 1 wherein said modulator means comprises a reactance modulator.

3. The apparatus as defined in claim 2 wherein said reactance modulator comprises a delay line.

4. The apparatus as defined in claim 2 and further comprising amplifier means connected between said reactance modulator and said summing device for amplifying said suppressed carrier double sideband signal.

5. The apparatus as defined in claim 4 wherein said phase locked loop means comprises a voltage controlled oscillator for selecting the frequency of said output signal, said frequency being a submultiple of the desired frequency of the modulated signal.

6. The apparatus as defined in claim 5 wherein said phase locked loop means further comprises
   (a) a reference oscillator for producing a reference frequency;
   (b) a summing device connected between said reference oscillator and said voltage controlled oscillator; and
   (c) a programmable divider connected in a feedback circuit between the output of said voltage controlled oscillator and said summing device for controlling the selected frequency of said output data signal, the data signal being input into said programmable divider.

7. A method for modulating a data signal in order to generate a plurality of narrow band signals for a communications system, comprising the steps of
   (a) synthesizing an output data signal having a selected frequency from the data signal;
   (b) dividing said output signal into two quadrature related signals;
   (c) modulating one of said quadrature related signals to generate a suppressed carrier double sideband signal;
   (d) combining said suppressed carrier double sideband signal with the other of said quadrature related signals to produce a modulated output signal; and
   (e) multiplying said modulated output signal to a desired frequency.

* * * * *